United States Patent [19]
Kirkpatrick

[11] 4,285,714
[45] Aug. 25, 1981

[54] ELECTROSTATIC BONDING USING EXTERNALLY APPLIED PRESSURE

[75] Inventor: Allen R. Kirkpatrick, Lexington, Mass.

[73] Assignee: Spire Corporation, Bedford, Mass.

[21] Appl. No.: 131,560

[22] Filed: Mar. 18, 1980

Related U.S. Application Data

[63] Continuation of Ser. No. 967,165, Dec. 7, 1978, abandoned.

[51] Int. Cl.³ ...................... C03B 23/20; C03C 29/00
[52] U.S. Cl. .......................................... 65/40; 65/59 B; 65/152; 65/155; 156/99; 156/102; 156/380; 219/118
[58] Field of Search .................. 65/36, 40, 42, 44, 54, 65/59 B, 152, 155; 156/99, 102, 380; 219/118

[56] References Cited

U.S. PATENT DOCUMENTS

| | | | |
|---|---|---|---|
| 3,310,392 | 3/1967 | Rhodes | 65/54 |
| 3,417,459 | 12/1968 | Pomerantz | 29/589 X |
| 3,714,706 | 2/1973 | Reizman | . |
| 4,141,712 | 2/1979 | Rogers | 65/59 B X |
| 4,178,164 | 12/1979 | Decker et al. | 65/59 B X |

FOREIGN PATENT DOCUMENTS 2301170 8/1973 Fed. Rep. of Germany ............. 65/40

*Primary Examiner*—Robert L. Lindsay, Jr.
*Attorney, Agent, or Firm*—Morse, Altman, Oates & Dacey

[57] ABSTRACT

A method and apparatus for electrostatic bonding of a layered structure having at least one glass stratum by heating the layered structure to a temperature above the annealing point of the glass stratum, by applying a predetermined pressure and voltage potential across the layered structure while the layered structure is maintained at an elevated temperature. Application of pressure across the heated layered structure permits electrostatic bonding of non-complemental surfaces to form a laminated structure.

12 Claims, 7 Drawing Figures

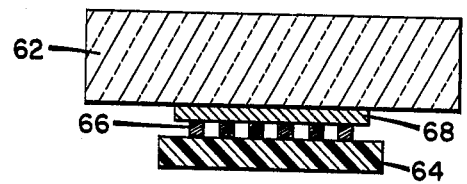
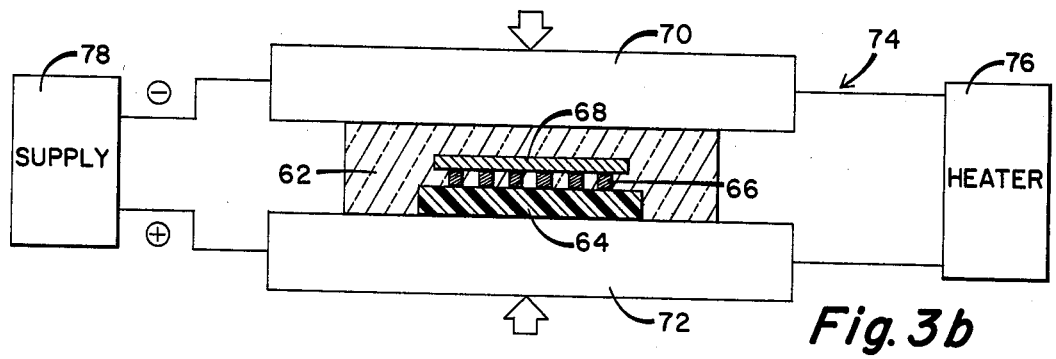

ELECTROSTATIC BONDING USING EXTERNALLY APPLIED PRESSURE

This is a continuation, of application Ser. No. 967,165 filed on Dec. 7, 1978 now abandoned.

BACKGROUND OF THE INVENTION

1. Field of the Invention

The present invention relates to electrostatic bonding and, more particularly, is directed towards a method and apparatus for electrostatic bonding of complemental and non-complemental surfaces.

2. Description of the Prior Art

Various methods for electrostatic bonding of a coductive member to a glass member are described in U.S. Pat. Nos. 3,417,459 and 3,557,629. Generally, bonding is accomplished by placing the members in close surface contact, by heating the glass member to a temperature below its softening point, and by applying an electrical potential across the members to produce an electrostatic force, thereby effecting a bond between the members. As noted in the above patents, when the members are brought together, even though they may have very smooth and complemental surfaces, there is intimate contact at only spaced points with intervening gaps. When the potential is applied across the unit, electrostatic attractive forces draw the members together, usually progressively, closing the gaps. In the case of non-complemental surfaces, the electrostatic attractive forces are insufficient to close all the gaps. Accordingly, such bonding methods have been met with varying degrees of success.

SUMMARY OF THE INVENTION

It is an object of the present invention to provide a method and apparatus for electrostatic bonding of materials which does not suffer from the heretofore mentioned disadvantages.

Another object of the present invention is to provide a method and apparatus for electrostatic bonding of materials with complemental and non-complemental surfaces.

A further object of the present invention is to provide a method and apparatus for electrostatic bonding of layered structures having at least one vitreous stratum and at least one stratum composed of a conductor, semiconductor or dielectric material by first heating the structure to a temperature above the annealing point of the glass stratum. Then, applying a predetermined pressure and voltage potential across the layered structure while maintaining the structure at an elevated temperature. Application of pressure across the heated layered structure with the glass stratum at a temperature above its annealing point results in complemental abutting surfaces for improved electrostatic bonding characteristics.

Other objects of the present invention will in part be obvious and will in part appear hereinafter.

The invention accordingly comprises the apparatuses and processes, together with their parts, steps, elements and interrelationships, that are exemplified in the following disclosure, the scope of which will be indicated in the appended claims.

BRIEF DESCRIPTION OF THE DRAWINGS

A fuller understanding of the nature and objects of the present invention will become apparent upon consideration of the following detailed description taken in connection with the accompanying drawings, wherein:

FIGS. 3(a) and 3(b) are cross-sectional views of a laminate structure having outer strata of glass, a silicon wafer stratum and an intermediate wire mesh stratum undergoing a process embodying the invention.

DETAILED DESCRIPTION OF THE PREFERRED EMBODIMENTS

The present invention involves an apparatus and a process of fabricating a laminated structure comprising at least one vitreous stratum for example a glass stratum and at least one conductor, semi-conductor or dielectric stratum. The process includes the steps of superposing the strata to form a layered assemblage, heating the assemblage to a temperature above the annealing point of the glass stratum, applying a predetermined pressure across the assemblage to deform the glass stratum and to provide complemental abutting surfaces for increased bonding characteristics and then applying a voltage potential across the assemblage for electrostatically bonding the structure.

Figure 1A:
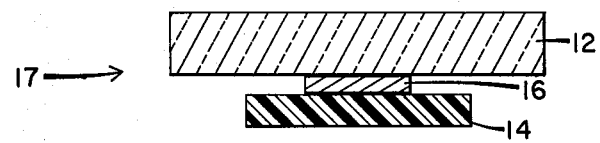
FIGS. 1(a) and 1(b) are cross-sectional views of a laminate structure of glass, silicon wafer and electrical contact ribbon undergoing a process embodying the invention.
Figure 1B:
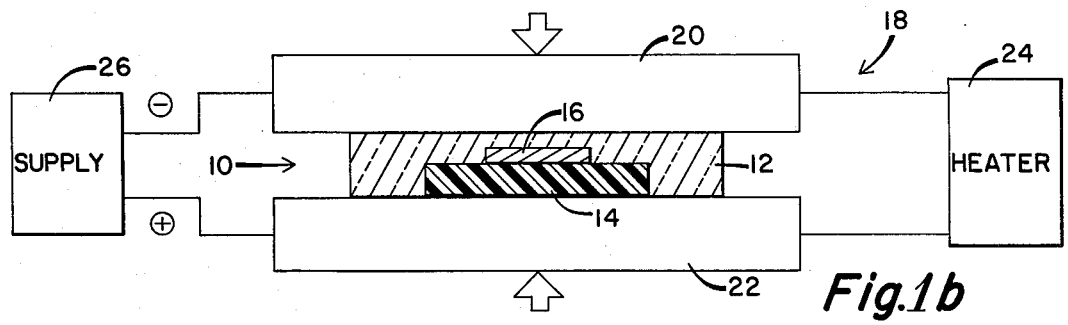

Referring now to the drawings, particularly FIGS. 1(a) and 1(b), there is shown the apparatus and process steps for fabricating a laminated structure 10 comprising a glass stratum 12, a silicon wafer 14 and a contact ribbon 16. Stratum 12 is a borosilicate 7070 glass stratum having a thickness of approximately 100 mils. Silicon wafer 14 is approximately 0.015 of an inch thick. Contact ribbon 16, which is composed of a conducting material, for example silver, is approximately 0.003 of an inch thick and 100 mils wide. As shown in FIG. 1(a) ribbon contact 16 is disposed between glass stratum 12 and silicon wafer 14.

After glass stratum 12, silicon wafer 14 and ribbon contact 16 are positioned in the manner depicted in FIG. 1(a) to form a layered assemblage 17, the assemblage is placed between a press 18 having a pair of die members 20, 22. A heater 24 is connected to die members 20, 22 for heating layered assemblage 17 to a temperature in the range of 450° to 800° C. A power supply 26 is connected to die members 20, 22 for applying a voltage potential in the range of 300 volts to 1500 volts across layered assemblage 17. Press 18, for example a hydraulic press, is capable of exerting a force in the range of 10 psi to 5000 psi on assemblage 17.

In the illustrated embodiment of FIG. 1(b), layered assemblage 17 is heated to a temperature of 600° by heater 24. Next, hydraulic press 18 is activated and a force of approximately 1000 psi is applied to layered assemblage 17 which is disposed between die members 20, 22. Preferably, layered assemblage 17 is preheated for approximately one minute prior to being placed between die members 20, 22 or is preheated by the die members prior to application of the pressure exerted by press 18. Finally, while maintaining the elevated temperature and applied pressure, a voltage potential of 1000 volts is exerted on assemblage 17, glass stratum 12 being negative with respect so silicon wafer 14. The pressure and voltage potential are applied to layered assemblage 17 for a specified time period from seconds to hours. In one embodiment, the pressure and voltage potential are applied to layered assemblage 17 for approximately three minutes. It is to be noted that layered assemblage 17 is maintained at an elevated temperature while pressure and voltage are being applied thereto. Application of pressure to glass stratum 12 while it is maintained at a temperature above its annealing point, deforms the glass stratum and results in complemental abutting surfaces for complete electrostatic bonding of the glass stratum and silicon wafer 14. Although the voltage potential is applied across laminated structure 30 subsequent to initial application of the pressure in the foregoing description, it is to be understood that, in an alternate embodiment, the pressure and the voltage potential are applied simultaneously.

Figure 2A:
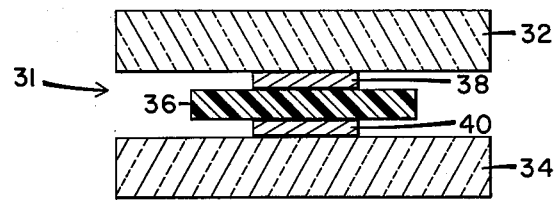
FIGS. 2(a), 2(b) and 2(c) are cross-sectional views of a laminate structure having outer glass strata, silicon wafer and a pair of ribbon contacts undergoing a process embodying the invention.
Figure 2B:
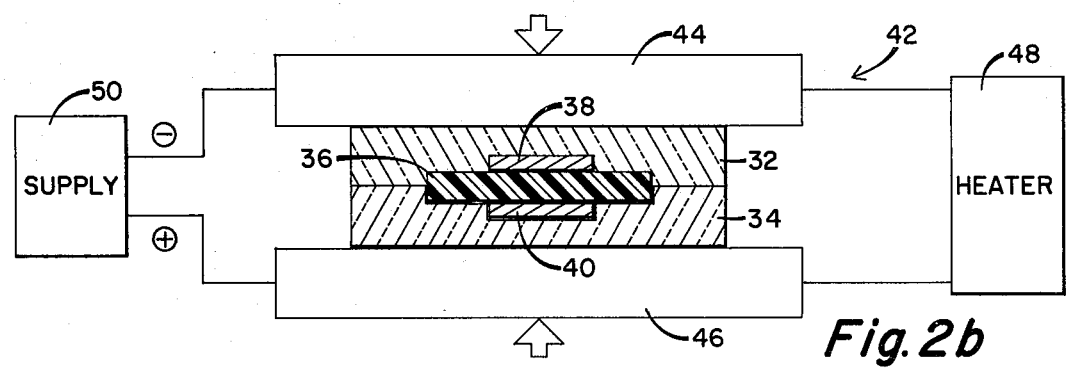
Figure 2C:
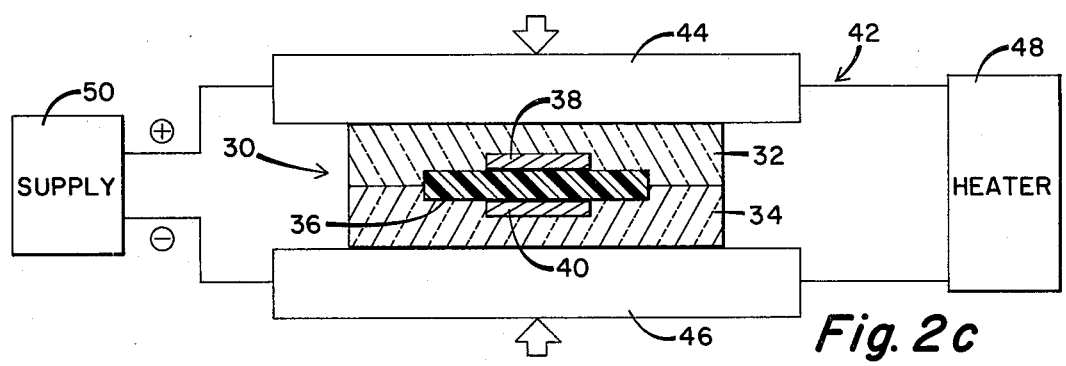

FIGS. 2(a), 2(b) and 2(c) depict a method and apparatus for fabricating a laminated structure 30. Initially, a plurality of strata are superimposed on one another to form a layered assemblage 31 comprising outer glass strata 32, 34; a silicon wafer 36 between the glass strata; and a pair of contact ribbons 38, 40. Contact ribbon 38 is disposed between glass stratum 32 and a silicon wafer 36, contact ribbon 40 is positioned between glass stratum 34 and the silicon wafer. The composition of glass strata 32, 34 and contact ribbon 38, 40 is similar to the composition of glass stratum 12 and contact ribbon 16.

Layered assemblage 31 is placed between a press 42 having a pair of die members 44, 46 for heating layered assemblage 31 to a temperature of in the range of 450° C. to 800° C. A power supply 50 is connected to die members 44, 46 for applying a voltage potential in the range of 300 volts to 1500 volts across layered assemblage 31. Press 42, for example a hydraulic press, is capable of exerting a force in the range of 10 psi to 5000 psi on layered assemblage 31.

In the preferred embodiment, layered assemblage 31 is preheated for one minute prior to being placed between die members 44, 46 or is preheated by the die members prior to application of pressure. Layered assemblage 31 is heated to a temperature of approximately 600° C. Next, hydraulic press 42 is actuated and a force of 3000 psi is exerted on layered structure 31. Next, a voltage potential of approximately 1000 volts is applied to glass strata 32, 34. Initially, as shown in FIG. 2(b), glass stratum 32 is negative with respect to glass stratum 34. In this case, glass stratum 32, silicon wafer 36 and contact ribbon 38 are bonded. The polarity is then reversed, FIG. 2(c), and glass stratum 34 is negative with respect to glass stratum 32. In this instance, glass stratum 34, silicon wafer 36 and contact ribbon 40 are bonded. The pressure and voltage potential are applied to layered assemblage 31 for a specified time period from seconds to hours. In one embodiment, the pressure and voltage potential are applied to layered assemblage 31 for approximately six minutes, three minutes for each polarity. It is to be noted that, during application of the pressure and the voltage, glass strata 32, 34 are maintained at a temperature above their annealing point. Application of pressure to layered assemblage 31 while it is maintained at such an elevated temperature deforms glass strata 32, 34 and results in complemental abutting surfaces for complete electrostatic bonding of laminated structure 30. As described in connection with the fabrication of laminated structure 10, in an alternate embodiment, the pressure and voltage are applied simultaneously rather than in sequence. However, in each case, glass strata 32, 34 are maintained at a temperature above their annealing point while pressure and voltage are being applied thereto.

Referring now to FIGS. 3(a) and 3(b), there is shown apparatus and process steps for fabricating a laminated structure 60 from a layered assemblage 61 of superimposed strata comprising a glass stratum 62, a silicon wafer 64 and a wire mesh contact member 66 and a contact ribbon 68. Wire mesh 66 and ribbon 68 are composed of a conducting material, for example silver and glass stratum 62 is a sheet of borosilicate 7070 glass having a thickness of approximately 100 mils. As shown in FIG. 3(a), wire mesh contact member 66 and contact ribbon 68 are sandwiched between glass stratum 62 and silicon wafer 64. Mesh wire contact member 66 is in juxtaposition with a surface of silicon wafer 64 and contact ribbon 68 is disposed between the wire mesh contact member and glass stratum 62.

Layered assemblage 61 is positioned between die members 70, 72 of a press 74, for example a hydraulic press capable of exerting a force in the range of 10 psi to 5000 psi on the layered assemblage. A heater 76 is connected to die members 70, 72 for heating layered assemblage 61 to a temperature in the range of 450° C. to 800° C. A power supply 78 is connected to die members 70, 72 for applying a voltage potential in the range of 200 volts to 2000 volts across layered assemblage 61. In the illustrated embodiment, layered assemblage 61 is preheated by die members 70, 72, the preheat period being approximately one minute. When glass stratum 64 is heated to a temperature above its annealing point, for example approximately 600° C., press 74 is actuated and a force of approximately 2000 psi is exerted on layered assemblage 61. Next, a voltage potential of approximately 1000 volts is applied across layered assemblage 61, glass stratum 62 being negative with respect to silicon wafer 64. It is to be noted that layered assemblage 61 is maintained at a temperature above the annealing point of glass stratum 64 while pressure and voltage is being applied thereto. Application of force to glass stratum 64 while it is at a temperature above its annealing point, deforms the glass stratum and results in complemental abutting surfaces for complete electrostatic bonding of laminated structure 60, the glass being forced between the open spaces of wire mesh contact member 62. The application of pressure and voltage continues for a specified time period from seconds to hours. In one embodiment, the application of pressure and voltage continues for a period of approximately three minutes. In the described embodiment, the voltage is applied to layered assemblage 61 after application of pressure. In an alternate embodiment, pressure and voltage are applied simultaneously to layered structure 61.

The invention just described provides a method and apparatus for complete electrostatic bonding of a layered assembly having at least one vitreous stratum and at least one stratum composed of a conductor, a semiconductor or a dielectric material, silicon being illustrated in the drawings by way of example. Complete electrostatic bonding is accomplished by superimposing the strata to form a layered assemblage, by heating the layered assemblage to a temperature above the annealing point of the vitreous stratum, and by applying pressure and a voltage potential across the assemblage for a predetermined time period to form a bonded laminated structure.

Since certain changes may be made in the foregoing disclosure without departing from the scope of the invention herein involved, it is intended that all matter contained in the above description and depicted in the accompanying drawings be construed in an illustrative and not in a limiting sense.

What is claimed is:

1. A method for electrostatically bonding both the contacting and the non-contacting surfaces of a layered structure including at least one vitreous stratum and at least one non-vitreous stratum, comprising:
   (a) preheating said layered structure at a temperature above the annealing point of said vitreous stratum;
   (b) molding said vitreous stratum, while maintaining said temperature above the annealing point thereof, by the simultaneous application of externally applied compression pressure to said layered structure, deforming thereby said vitreous stratum about said non-vitreous stratum so as to effect complementary, fully contacting surfaces between said vitreous and said non-vitreous strata; and
   (c) applying a voltage of sufficient magnitude across said layered structure for electrostatically bonding said vitreous to said non-vitreous strata along said complementary, fully contacting surfaces therebetween, while maintaining said temperature and said externally applied compression pressure.

2. The method of claim 1 wherein said preheating is effected for about one minute.

3. The method of claim 1 wherein said molding step is effected for about three minutes following said preheating step of about one minute duration.

4. The method of claim 1 wherein said voltage is about 1,000 VDC.

5. A method for fabricating an electrostatically bonded laminated structure comprising the steps of:
   (a) superimposing a first stratum and a second stratum to form a layered structure, said first stratum being composed of a vitreous material and said second stratum being a conductor, semiconductor or a dielectric stratum, at least a portion of a surface of said first stratum in contact with at least a portion of a surface of said second stratum;
   (b) heating said layered structure to a temperature at which said vitreous material deforms;
   (c) exerting a pressure on said layered structure, said first stratum pressed against said second stratum, said surface of said first stratum molded by and conforming to said surface of said second stratum due to deformation of said vitreous stratum at said temperature and pressure, said surface of said first stratum molded into a surface which is complementary to said surface of said second stratum, whereby said contacting surfaces are in full contact with one another; and
   (d) applying a voltage potential across said layered structure to form an electrostatically bonded, laminated structure.

6. The method as claimed in claim 5 including the step of positioning said layered structure in a press, said pressure being exerted on said layered structure by said press, said layered structure being maintained at said elevated temperature prior to exertion of said pressure thereon.

7. The method of claim 4 wherein the positive terminal of said DC voltage is first connected to one side of said layered structure for a predetermined time, and then said positive terminal is connected to the other side of said layered structure for an equal length predetermined time.

8. The method of claim 1 wherein said non-vitreous stratum is a wire mesh member and the resultant electrostatically bonded layered structure is characterized in that portions of said vitreous stratum are forced to penetrate into and through the open spaces of said wire mesh member during said molding step, combining heat and externally applied compression pressure.

9. An apparatus for fabricating a bonded laminated structure having at least one vitreous stratum abutting at least one other stratum, said other stratum being a conductor or a semiconductor or a dielectric, said apparatus comprising:
   (a) press means having a pair of die members, a layered structure of said strata carried on one of said die members;
   (b) heating means connected to said press means for heating said layered structure carried on said die member to a sufficiently high temperature at which said vitreous stratum deforms; and
   (c) power means connected to said press means for applying a voltage potential across said layered structure;
   (d) said press means exerting sufficient pressure to deform said vitreous stratum at said elevated temperature, the surface of said vitreous stratum molded against and conforming to the surface of said other stratum to form complementary contacting surfaces between said strata for full contact between said abutting surfaces;
   (e) said power means sufficient to form an electrostatically bonded laminated structure when said voltage potential is applied across said layered structure while said layered structure is maintained at said elevated temperature and said pressure is applied thereto.

10. The apparatus of claim 9 wherein said heating means is constructed to raise the temperature of said layered structure to above the annealing temperature of said vitreous stratum.

11. The apparatus as claimed in claim 9 wherein the pressure exerted by said press is at least 1,000 psi.

12. The apparatus as claimed in claim 9 wherein the voltage generated by said power means is at least 1,000 volts.

* * * * *